US010121739B1

(12) United States Patent
Kirby

(10) Patent No.: US 10,121,739 B1
(45) Date of Patent: Nov. 6, 2018

(54) MULTI-DIE INDUCTORS WITH COUPLED THROUGH-SUBSTRATE VIA CORES

(71) Applicant: Micron Technology, Inc., Boise, ID (US)

(72) Inventor: Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/584,881

(22) Filed: May 2, 2017

(51) Int. Cl.
*H01L 29/00* (2006.01)
*H01L 23/522* (2006.01)
*H01L 23/48* (2006.01)

(52) U.S. Cl.
CPC ........ *H01L 23/5227* (2013.01); *H01L 23/481* (2013.01)

(58) Field of Classification Search
CPC .. H01L 23/5227; H01L 23/481; H01L 23/645
USPC ........................................................ 257/531
See application file for complete search history.

(56) References Cited

U.S. PATENT DOCUMENTS

| 5,095,357 A | 3/1992 | Andoh et al. |
| 2009/0140383 A1 | 6/2009 | Chang et al. |
| 2009/0243035 A1 | 10/2009 | Mashino et al. |
| 2009/0267084 A1 | 10/2009 | Bilger et al. |
| 2010/0164671 A1* | 7/2010 | Pagani .............. H01L 23/48 336/200 |
| 2011/0084782 A1 | 4/2011 | Kanno |
| 2011/0156488 A1 | 6/2011 | Kuroda |
| 2012/0068301 A1 | 3/2012 | Sin et al. |
| 2012/0256290 A1 | 10/2012 | Renna et al. |
| 2013/0056847 A1 | 3/2013 | Chen |
| 2013/0063234 A1 | 3/2013 | Kamath et al. |
| 2013/0168809 A1 | 7/2013 | Yen et al. |
| 2013/0187255 A1 | 7/2013 | Wang et al. |

(Continued)

FOREIGN PATENT DOCUMENTS

| EP | 0725407 A1 | 8/1996 |
| KR | 20110011691 U | 12/2011 |

(Continued)

OTHER PUBLICATIONS

U.S. Appl. No. 15/584,278—Unpublished Patent Application by Kyle K. Kirby, titled "Semiconductor Devices With Back-Side Coils for Wireless Signal and Power Coupling", filed May 2, 2017, 35 pages.
U.S. Appl. No. 15/584,310—Unpublished Patent Application by Kyle K. Kirby, titled "Semiconductor Devices With Through-Substrate Coils for Wireless Signal and Power Coupling", filed May 2, 2017, 27 pages.

(Continued)

*Primary Examiner* — Tu-Tu Ho
(74) *Attorney, Agent, or Firm* — Perkins Coie LLP

(57) ABSTRACT

A semiconductor device comprising first and second dies is provided. The first die includes a first through-substrate via (TSV) extending at least substantially through the first die and a first substantially helical conductor disposed around the first TSV. The second die includes a second TSV coupled to the first TSV and a second substantially helical conductor disposed around the second TSV. The first substantially helical conductor is configured to induce a change in a magnetic field in the first and second TSVs in response to a first changing current in the first substantially helical conductor, and the second substantially helical conductor is configured to have a second changing current induced therein in response to the change in the magnetic field in the second TSV.

20 Claims, 13 Drawing Sheets

(56) References Cited

U.S. PATENT DOCUMENTS

| | | |
|---|---|---|
| 2013/0321094 A1 | 12/2013 | Sumida et al. |
| 2014/0061854 A1 | 3/2014 | Chen |
| 2014/0131841 A1 | 5/2014 | Tseng et al. |
| 2014/0159196 A1 | 6/2014 | Mackh et al. |
| 2014/0217546 A1 | 8/2014 | Yen et al. |
| 2014/0225208 A1 | 8/2014 | Gu et al. |
| 2014/0323046 A1 | 10/2014 | Asai et al. |
| 2015/0115405 A1 | 4/2015 | Wu et al. |
| 2017/0005046 A1 | 1/2017 | Sin et al. |
| 2017/0330930 A1 | 11/2017 | Cook et al. |

FOREIGN PATENT DOCUMENTS

| | | |
|---|---|---|
| WO | 2014045518 A1 | 3/2014 |
| WO | 2014123790 A1 | 8/2014 |
| WO | 2016094651 A1 | 6/2016 |

OTHER PUBLICATIONS

U.S. Appl. No. 15/584,294—Unpublished Patent Application by Kyle K. Kirby, titled "Inductors With Through-Substrate Via Cores", filed May 2, 2017, 39 pages.

U.S. Appl. No. 15/584,965—Unpublished Patent Application by Kyle K. Kirby, titled "3D Interconnect Multi-Die Inductors With Through-Substrate Via Cores", filed May 2, 2017, 50 pages.

International Application No. PCT/US2018/026239—International Search Report and Written Opinion, dated Jul. 26, 2018, 10 pages.

International Application No. PCT/US2018/026253—International Search Report and Written Opinion, dated Jul. 27, 2018, 13 pages.

International Application No. PCT/US2018/026256—International Search Report and Written Opinion, dated Jul. 4, 2018, 16 pages.

International Application No. PCT/US2018/026263—International Search Report and Written Opinion, dated Jul. 4, 2018, 16 pages.

International Application No. PCT/US2018/026269—International Search Report and Written Opinion, dated Jul. 5, 2018, 14 pages.

\* cited by examiner

MULTI-DIE INDUCTORS WITH COUPLED THROUGH-SUBSTRATE VIA CORES

CROSS-REFERENCE TO RELATED APPLICATION(S)

This application contains subject matter related to a U.S. Patent Application by Kyle K. Kirby, entitled "SEMICONDUCTOR DEVICES WITH BACK-SIDE COILS FOR WIRELESS SIGNAL AND POWER COUPLING." The related application, of which the disclosure is incorporated by reference herein, is assigned to Micron Technology, Inc., and is identified as U.S. application Ser. No. 15/584,278, filed May 2, 2017.

This application contains subject matter related to a U.S. Patent Application by Kyle K. Kirby, entitled "SEMICONDUCTOR DEVICES WITH THROUGH-SUBSTRATE COILS FOR WIRELESS SIGNAL AND POWER COUPLING." The related application, of which the disclosure is incorporated by reference herein, is assigned to Micron Technology, Inc., and is identified as U.S. application Ser. No. 15/584,310, filed May 2, 2017.

This application contains subject matter related to a U.S. Patent Application by Kyle K. Kirby, entitled "INDUCTORS WITH THROUGH-SUBSTRATE VIA CORES." The related application, of which the disclosure is incorporated by reference herein, is assigned to Micron Technology, Inc., and is identified as U.S. application Ser. No. 15/584,294, filed May 2, 2017.

This application contains subject matter related to a U.S. Patent Application by Kyle K. Kirby, entitled "3D INTERCONNECT MULTI-DIE INDUCTORS WITH THROUGH-SUBSTRATE VIA CORES." The related application, of which the disclosure is incorporated by reference herein, is assigned to Micron Technology, Inc., and is identified as U.S. application Ser. No. 15/584,965, filed May 2, 2017.

TECHNICAL FIELD

The present disclosure generally relates to semiconductor devices, and more particularly relates to semiconductor devices including multi-die inductors with through-substrate via cores, and methods of making and using the same.

BACKGROUND

As the need for miniaturization of electronic circuits continues to increase, the need to minimize various circuit elements, such as inductors, increases apace. Inductors are an important component in many discrete element circuits, such as impedance-matching circuits, linear filters, and various power circuits. Since traditional inductors are bulky components, successful miniaturization of inductors presents a challenging engineering problem.

One approach to miniaturizing an inductor is to use standard integrated circuit building blocks, such as resistors, capacitors, and active circuitry, such as operational amplifiers, to design an active inductor that simulates the electrical properties of a discrete inductor. Active inductors can be designed to have a high inductance and a high Q factor, but inductors fabricated using these designs consume a great deal of power and generate noise. Another approach is to fabricate a spiral-type inductor using conventional integrated circuit processes. Unfortunately, spiral inductors in a single level (e.g., plane) occupy a large surface area, such that the fabrication of a spiral inductor with high inductance can be cost- and size-prohibitive. Accordingly, there is a need for other approaches to the miniaturization of inductive elements in semiconductor devices.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices are continually designed with ever greater needs for inductors with high inductance that occupy a small area. These needs are especially acute in multi-die devices with coupled inductors in different dies, where the efficiency of the inductor coupling can depend in part upon the inductors having high inductance. Accordingly, several embodiments of semiconductor devices in accordance with the present technology can provide multi-die coupled inductors having through-substrate via cores, which can provide high inductance and efficient coupling while consuming only a small area.

Several embodiments of the present technology are directed to semiconductor devices comprising multiple dies. A first die of the device includes a first through-substrate via (TSV) extending at least substantially through the first die and a first substantially helical conductor disposed around the first TSV. A second die of the device includes a second TSV coupled to the first TSV and a second substantially helical conductor disposed around the second TSV. The first substantially helical conductor can be a non-planar spiral configured to induce a change in a magnetic field in the first and second TSVs in response to a first changing current in the first substantially helical conductor, and the second substantially helical conductor can be a non-planar spiral configured to have a second changing current induced therein in response to the change in the magnetic field in the second TSV.

Figure 1:
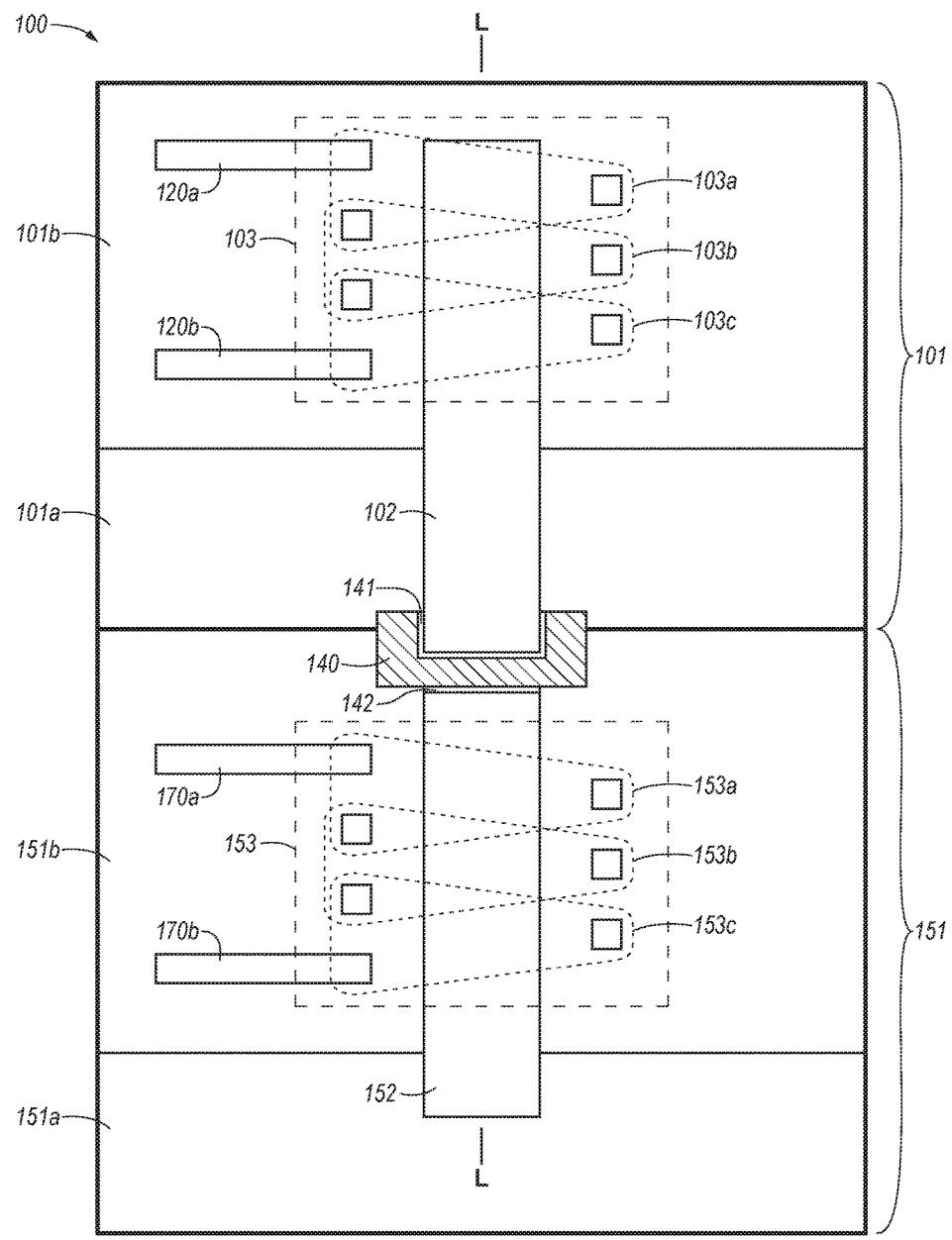
FIG. 1 is a simplified cross-sectional view of a multi-die semiconductor device including coupled inductors with through-substrate via cores configured in accordance with an embodiment of the present technology.

FIG. 1 is a simplified cross-sectional view of a multi-die semiconductor device 100 including coupled inductors with TSV cores configured in accordance with an embodiment of the present technology. The device 100 includes a first die 101 and a second die 151. The first die 101 has a first substrate 101a and a first insulating material 101b. The device 100 further includes a first TSV 102 that extends at least substantially through the first die 101 (e.g., extending from approximately the bottom of the first substrate 101a to beyond an upper surface of the first substrate 101a—completely through the first substrate 101a—and into the first insulating material 101b). The device 100 also includes a first substantially helical conductor 103 ("conductor 103") disposed around the first TSV 102. In the present embodiment, the first conductor 103 is shown to include three complete turns (103a, 103b, and 103c) around the first TSV 102. The first conductor 103 can be operably connected to other circuit elements (not shown) by leads 120a and 120b.

The turns 103a-103c of the first conductor 103 are electrically insulated from one another and from the first TSV 102. In one embodiment, the first insulating material 101b electrically isolates the first conductor 103 from the first TSV 102. In another embodiment, the first conductor 103 can have a conductive inner region covered (e.g., coated) by a dielectric or insulating outer layer. For example, an outer layer of the first conductor 103 can be an oxide layer, and an inner region of the first conductor 103 can be copper, gold, tungsten, or alloys thereof. The first TSV 102 can also include an outer layer and a magnetic material within the outer layer. The outer layer can be a dielectric or insulating material (e.g., silicon oxide, silicon nitride, polyimide, etc.) that electrically isolates the magnetic material of the first TSV 102 from the first conductor 103. One aspect of the first conductor 103 is that the individual turns 103a-103c define a non-planar spiral with respect to the longitudinal dimension "L" of the first TSV 102. Each subsequent turn 103a-103c is at a different elevation along the longitudinal dimension L of the first TSV 102 in the non-planar spiral of the first conductor 103.

According to one embodiment of the present technology, the first substrate 101a can be any one of a number of substrate materials suitable for semiconductor processing methods, including silicon, glass, gallium arsenide, gallium nitride, organic laminates, and the like. As will be readily understood by those skilled in the art, a through-substrate via, such as the first TSV 102, can be made by etching a high-aspect-ratio hole into a substrate material and filling it with one or more materials in one or more deposition and/or plating steps. Accordingly, the first TSV 102 extends at least substantially through the first substrate 101a, which is unlike other circuit elements that are additively constructed on top of the first substrate 101a. For example, the first substrate 101a can be a thinned silicon wafer of about 100 µm thickness, and the first TSV 102 can extend completely through the first substrate 101a, such that a lowermost portion of the first TSV 102 can be exposed for mechanical and/or electrical connection to elements in another die.

The second die 151 has a second substrate 151a, a second insulating material 151b, and a second TSV 152 in the second die 151 extending out of the second substrate 151a and into the second insulating material 151b. The device 100 further includes a second substantially helical conductor 153 ("conductor 153") disposed around the second TSV 152. In the present embodiment, the second conductor 153 is shown to include three complete turns (153a, 153b, and 153c) around the second TSV 152. The second conductor 153 can be operably connected to other circuit elements (not shown) by leads 170a and 170b.

The three turns 153a-153c of the second conductor 153 are electrically insulated from one another and from the second TSV 152. In one embodiment, the second insulating material 151b electrically isolates the second conductor 153 from the second TSV 152. In another embodiment, the second conductor 153 can have a conductive inner region covered (e.g., coated) by a dielectric or insulating outer layer. For example, an outer layer of the second conductor 153 can be an oxide layer, and an inner region of the second conductor 153 can be copper, gold, tungsten, or alloys thereof. The second TSV 152 can also include an outer layer and a magnetic material within the outer layer. The outer layer can be a dielectric or insulating material (e.g., silicon oxide, silicon nitride, polyimide, etc.) that electrically isolates the magnetic material of the second TSV 152 from the second conductor 153. One aspect of the second conductor 153 is that the individual turns 153a-153c define a non-planar spiral with respect to the longitudinal dimension "L" of the second TSV 152. Each subsequent turn 153a-153c is at a different elevation along the longitudinal dimension L of the second TSV 152 in the non-planar spiral of the second conductor 153.

According to one embodiment of the present technology, the second substrate 151a can be any one of a number of substrate materials suitable for semiconductor processing methods, including silicon, glass, gallium arsenide, gallium nitride, organic laminates, and the like. As will be readily understood by those skilled in the art, a through-substrate via, such as the second TSV 152, can be made by etching a high-aspect-ratio hole into a substrate material and filling it with one or more materials in one or more deposition and/or plating steps. Accordingly, the second TSV 152 extends substantially into the second substrate 151a, unlike other circuit elements that are additively constructed on top of the second substrate 151a. For example, the second substrate 151a can be a silicon wafer of about 800 µm thickness, and the second TSV 152 can extend from 30 to 100 µm into the second substrate 151a. In other embodiments, a TSV may extend even further into a substrate material (e.g., 150 µm, 200 µm, etc.), or may extend into a substrate material by as little as 10 µm.

According to one embodiment, the first conductor 103 can be configured to induce a magnetic field in the first and second TSVs 102 and 152 in response to a current passing through the first conductor 103 (e.g., provided by a voltage differential applied across the leads 120a and 120b). By changing the current passing through the first conductor 103 (e.g., by applying an alternating current, or by repeatedly switching between high and low voltage states), a changing magnetic field can be induced in the first and second TSVs 102 and 152, which in turn induces a changing current in the second conductor 153. In this fashion, signals and/or power can be coupled between a circuit comprising the first conductor 103 and another comprising the second conductor 153.

In another embodiment, the second conductor 153 can be configured to induce a magnetic field in the first and second TSVs 102 and 152 in response to a current passing through the second conductor 153 (e.g., provided by a voltage differential applied across leads 170a and 170b). By changing the current passing through the second conductor 153 (e.g., by applying an alternating current, or by repeatedly switching between high and low voltage states), a changing magnetic field can be induced in the first and second TSVs 102 and 152, which in turn induces a changing current in the first conductor 103. In this fashion, signals and/or power can be coupled between a circuit comprising the second conductor 153 and another comprising the first conductor 103.

In accordance with one embodiment of the present technology, the two TSVs 102 and 152 can include a magnetic material (e.g., a material with a higher magnetic permeability than the materials of the first and second substrates 101a and 151a and/or the first and second insulating materials 101b and 151b) to increase the magnetic field in the two TSVs 102 and 152 when current is flowing through the first and/or second conductors 103 and/or 153. The magnetic material can be ferromagnetic, ferrimagnetic, or a combination thereof. In one embodiment, the two TSVs 102 and 152 can have the same composition, and in other embodiments, the two TSVs 102 and 152 can have different compositions. The two TSVs 102 and 152 can include more than one material, either in a bulk material of a single composition or in discrete regions of different materials (e.g., coaxial laminate layers). For example, the two TSVs 102 and 152 can include nickel, iron, cobalt, niobium, or alloys thereof.

The two TSVs 102 and 152 can include a bulk material with desirable magnetic properties (e.g., elevated magnetic permeability provided by nickel, iron, cobalt, niobium, or an alloy thereof), or can include multiple discrete layers, only some of which are magnetic, in accordance with an embodiment of the present technology. For example, following a high-aspect ratio etch and a deposition of insulator, each of the first and second TSVs 102 and 152 can be provided in a single metallization step filling in the insulated opening with a magnetic material. In another embodiment, each of the first and second TSVs 102 and 152 can be formed in multiple steps to provide coaxial layers (e.g., two or more magnetic layers separated by one or more non-magnetic layers). For example, multiple conformal plating operations can be performed before a bottom-up fill operation to provide a TSV with a coaxial layer of non-magnetic material separating a core of magnetic material and an outer coaxial layer of magnetic material. In this regard, a first conformal plating step can partially fill and narrow the etched opening with a magnetic material (e.g., nickel, iron, cobalt, niobium, or an alloy thereof), a second conformal plating step can further partially fill and further narrow the opening with a non-magnetic material (e.g., polyimide or the like), and a subsequent bottom-up plating step (e.g., following the deposition of a seed material at the bottom of the narrowed opening) can completely fill the narrowed opening with another magnetic material (e.g., nickel, iron, cobalt, niobium, or an alloy thereof). Such a structure with laminated coaxial layers of magnetic and non-magnetic material can help to reduce eddy current losses in a TSV through which a magnetic flux is passing.

In accordance with one embodiment of the present technology, the first and second TSVs 102 and 152 can be coupled in any one of a number of ways to improve the magnetic permeability of the path followed by a magnetic field generated by a current through one of the two conductors 103 and 153. For example, in the embodiment illustrated in FIG. 1, the first TSV 102 is coupled to the second TSV 152 by a solder connection 140. The solder connection 140 can be separated from the first TSV 102 by a barrier material 141 and separated from the second TSV 152 by another barrier material 142. The barrier materials 141 and 142 can be configured to prevent solder diffusion into the two TSVs 102 and 152. The solder material 140 can include a magnetic material to enhance its magnetic permeability. For example, the solder material 140 can include nickel, iron, cobalt, niobium, or alloys thereof. In other embodiments, TSVs in adjacent dies can be coupled using any one of a number of other interconnect methods (e.g., copper-to-copper bonding, pill and pad, interference fit, mechanical, etc.).

A conductive winding (e.g., the conductors 103 and 153) of an inductor disposed around a TSV magnetic core (e.g., the TSVs 102 and 152) need not be smoothly helical in several embodiments of the present technology. Although the conductors 103 and 153 are illustrated schematically and functionally in FIG. 1 as having turns that, in cross section, appear to gradually increase in distance from a surface of a respective substrate, it will be readily understood by those skilled in the art that fabricating a smooth helix with an axis perpendicular to a surface of a substrate presents a significant engineering challenge. Accordingly, a "substantially helical" conductor, as used herein, describes a conductor having turns that are separated along the longitudinal dimension L of the TSV (e.g., the z-dimension perpendicular to the substrate surface), but which are not necessarily smoothly varying in the z-dimension (e.g., the substantially helical shape does not possess arcuate, curved surfaces and a constant pitch angle). Rather, an individual turn of the conductor can have a pitch of zero degrees and the adjacent turns can be electrically coupled to each other by steeply-angled or even vertical connectors (e.g., traces or vias) with a larger pitch, such that a "substantially helical" conductor can have a stepped structure. Moreover, the planar shape traced out by the path of individual turns of a substantially helical conductor need not be elliptical or circular. For the convenience of integration with efficient semiconductor processing methodologies (e.g., masking with cost-effective reticles), individual turns of a substantially helical conductor can trace out a polygonal path in a planar view (e.g., a square, a hexagon, an octagon, or some other regular or irregular polygonal shape around the first TSV 102). Accordingly, a "substantially helical" conductor, as used herein, describes a non-planar spiral conductor having turns that trace out any shape in a planar view (e.g., parallel to the plane of the substrate surface) surrounding a central axis, including circles, ellipses, regular polygons, irregular polygons, or some combination thereof.

Figure 2:
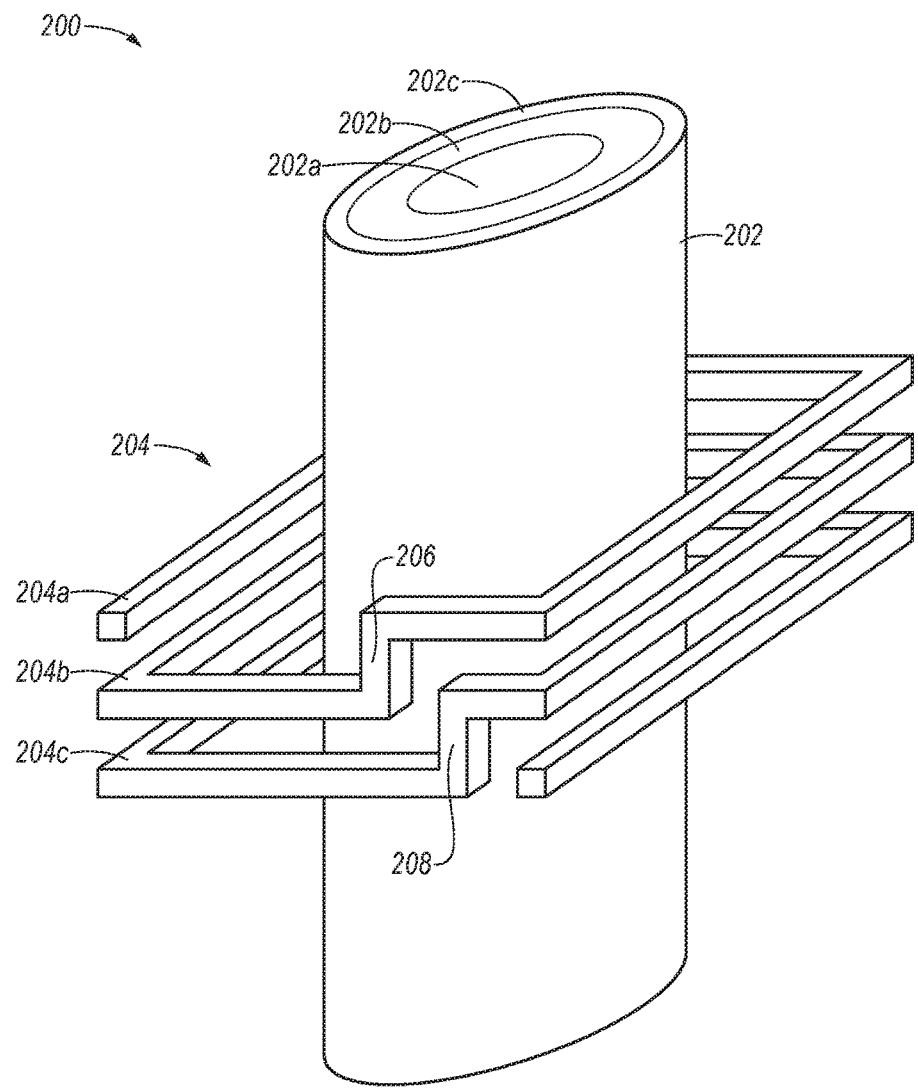
FIG. 2 is a simplified perspective view of a substantially helical conductor disposed around a through-substrate via configured in accordance with an embodiment of the present technology.

FIG. 2 is a simplified perspective view of a substantially helical conductor 204 ("conductor 204") disposed around a through-substrate via 202 configured in accordance with an embodiment of the present technology. For more easily illustrating the substantially helical shape of the conductor 204 illustrated in FIG. 2, the substrate material, insulating materials, and other details of the device in which the conductor 204 and the TSV 202 are disposed have been eliminated from the illustration. As can be seen with reference to FIG. 2, the conductor 204 is disposed coaxially around the TSV 202. The conductor 204 of this particular embodiment has three turns (204a, 204b, and 204c) about the TSV 202. As described above, rather than having a single pitch angle, the conductor 204 has a stepped structure, whereby turns with a pitch angle of 0 (e.g., turns laying in a plane of the device 200) are connected by vertical connecting portions that are staggered circumferentially around the turns. In this regard, planar turns 204a and 204b are connected by a vertical connecting portion 206, and planar turns 204b and 204c are connected by a vertical connecting portion 208. This stepped structure facilitates fabrication of the conductor 204 using simple semiconductor processing techniques (e.g., planar metallization steps for the turns and via formation for the vertical connecting portions). Moreover, as shown in FIG. 2, the turns 204a, 204b, and 204c of the conductor 204 trace a rectangular shape around the TSV 202 when oriented in a planar view.

In accordance with one embodiment, the TSV 202 can optionally (e.g., as shown with dotted lines) include a core material 202a surrounded by one or more coaxial layers, such as layers 202b and 202c. For example, the core 202a and the outer coaxial layer 202c can include magnetic materials, while the middle coaxial layer 202b can include a non-magnetic material, to provide a laminate structure that can reduce eddy current losses. Although the TSV 202 is illustrated in FIG. 2 as optionally including a three-layer structure (e.g., a core 202a surrounded by two coaxially laminated layers 202b and 202c), in other embodiments any number of coaxial laminate layers can be used to fabricate a TSV.

Although in the foregoing embodiments shown in FIG. 1 and FIG. 2 substantially helical conductors have been illustrated as having three turns about a TSV, the number of turns of a substantially helical conductor around a TSV can vary in accordance with different embodiments of the technology. As is shown in the example embodiment of FIG. 2, a substantially helical conductor need not make an integer number of turns about a TSV (e.g., the top and/or bottom turn may not be a complete turn). Providing more turns can increase the inductance of an inductor compared to having fewer turns, but at an increase in the cost and complexity of fabrication (e.g., more fabrication steps). The number of turns can be as low as one, or as high as is desired. When coupled inductors are provided with the same number of windings, they can couple two electrically isolated circuits without stepping up or down the voltage from the primary winding.

Figure 3:
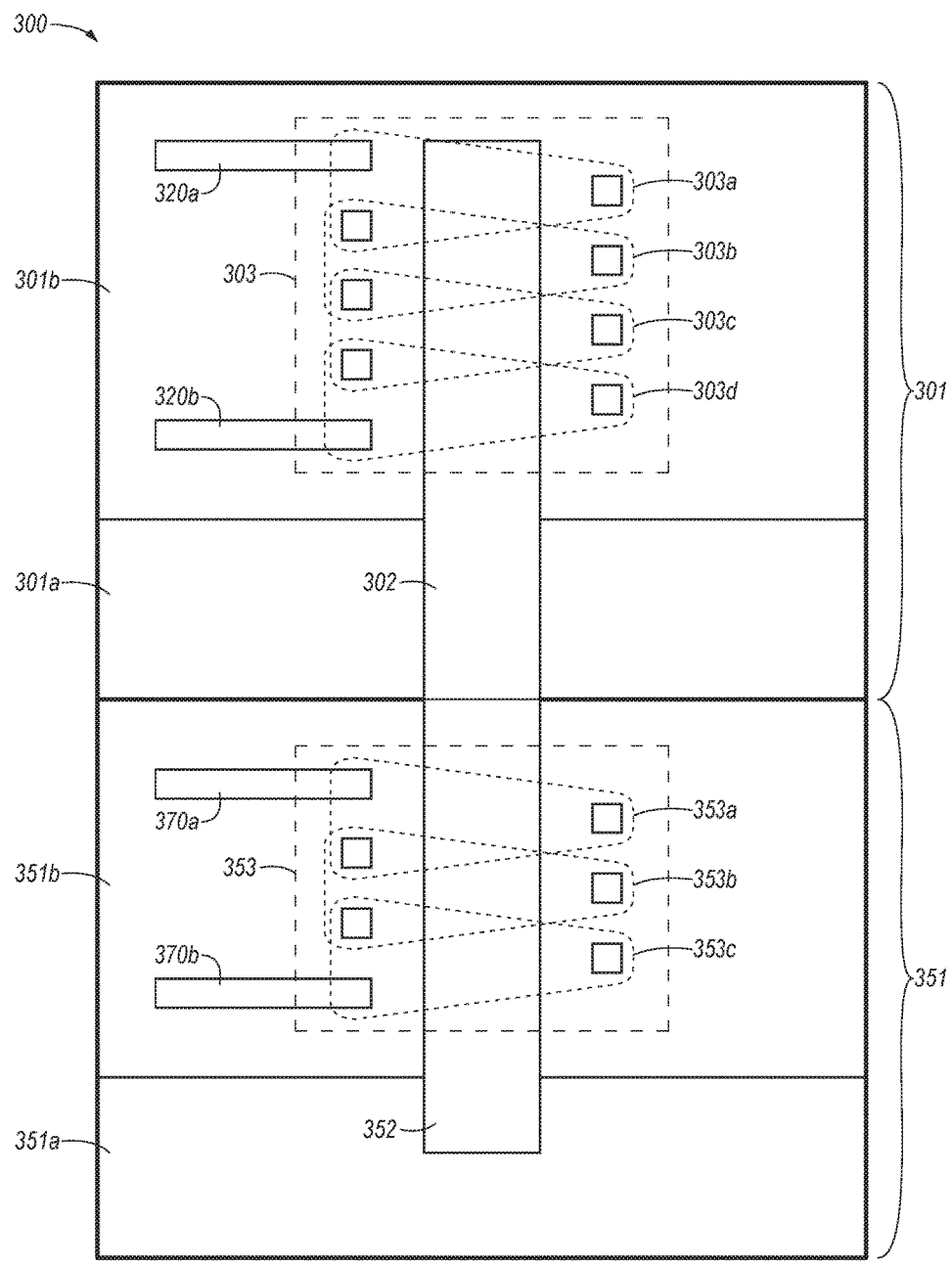
FIG. 3 is a simplified cross-sectional view of a multi-die semiconductor device including coupled inductors with through-substrate via cores configured in accordance with an embodiment of the present technology.

For example, FIG. 3 is a simplified cross-sectional view of a multi-die semiconductor device 300 including coupled inductors with TSV cores configured in accordance with an embodiment of the present technology. The device 300 includes a first die 301 and a second die 351. The first die has a first substrate 301a and a first insulating material 301b. The device 300 further includes a first TSV 302 that extends at least substantially through the first die 301 (e.g., extending from approximately the bottom of the first substrate 301a to beyond an upper surface of the first substrate 301a—completely through the first substrate 301a—and into the first insulating material 301b). The device 300 also includes a first substantially helical conductor 303 ("conductor 303") disposed around the first TSV 302. In the present embodiment, the first conductor 303 is shown to include four complete turns (303a, 303b, 303c and 303d) around the first TSV 302. The first conductor 303 can be operably connected to other circuit elements (not shown) by leads 320a and 320b.

The second die 351 has a second substrate 351a, a second insulating material 351b, and a second TSV 352 in the second die 351 extending out of the second substrate 351a and into the second insulating material 351b. The device 300 further includes a second substantially helical conductor 353 ("conductor 353") disposed around the second TSV 352. In the present embodiment, the second conductor 353 is shown to include three complete turns (353a, 353b, and 353c) around the second TSV 352. The second conductor 353 can be operably connected to other circuit elements (not shown) by leads 370a and 370b.

As set forth above, coaxial columns of TSVs can be coupled in any one of a number of ways to improve the magnetic permeability thereof. For example, in the present embodiment of FIG. 3, the first and second TSVs 302 and 352 are mechanically coupled by a direct connection. Unlike TSVs configured to carry electrical signals, the electrical resistance of the connection between these two TSVs 302 and 352 is not a primary concern in configuring a path with high magnetic permeability. Accordingly, many of the steps utilized to improve the electrical connection between coupled TSVs (e.g., under bump metallization, solder ball formation, solder reflow, etc.) can be omitted from a manufacturing method of the device 300, in accordance with one embodiment of the present technology.

According to one embodiment, the first conductor 303 is configured to induce a magnetic field in the first and second TSVs 302 and 352 in response to a current passing through the first conductor 303 (e.g., provided by a voltage applied across leads 320a and 320b). By changing the current passing through the first conductor 303 (e.g., by applying an alternating current, or by repeatedly switching between high and low voltage states), a changing magnetic field can be induced in the two TSVs 302 and 352, which in turn induces a changing current in the second conductor 353. In this fashion, signals and/or power can be coupled between a circuit comprising the first conductor 303 and another comprising the second conductor 353 (e.g., operating the device 300 as a power transformer).

The first conductor 303 and the second conductor 353 shown in FIG. 3 have different numbers of turns. As will be readily understood by one skilled in the art, this arrangement allows the device 300 to be operated as a step-up or step-down transformer (depending upon which substantially helical conductor is utilized as the primary winding and which the secondary winding). For example, the application of a first changing current (e.g., 4V of alternating current) to the first conductor 303 will induce a changing current with a lower voltage (e.g., 3V of alternating current) in the second conductor 353, given the 4:3 ratio of turns between the primary and secondary windings in this configuration. When operated as a step-up transformer (e.g., by utilizing the second conductor 353 as the primary winding, and the first conductor 303 as the secondary winding), the application of a first changing current (e.g., 3V of alternating current) to the second conductor 353 will induce a changing current with a higher voltage (e.g., 4V of alternating current) in the first conductor 303, given the 3:4 ratio of turns between the primary and secondary windings in this configuration.

Figure 4:
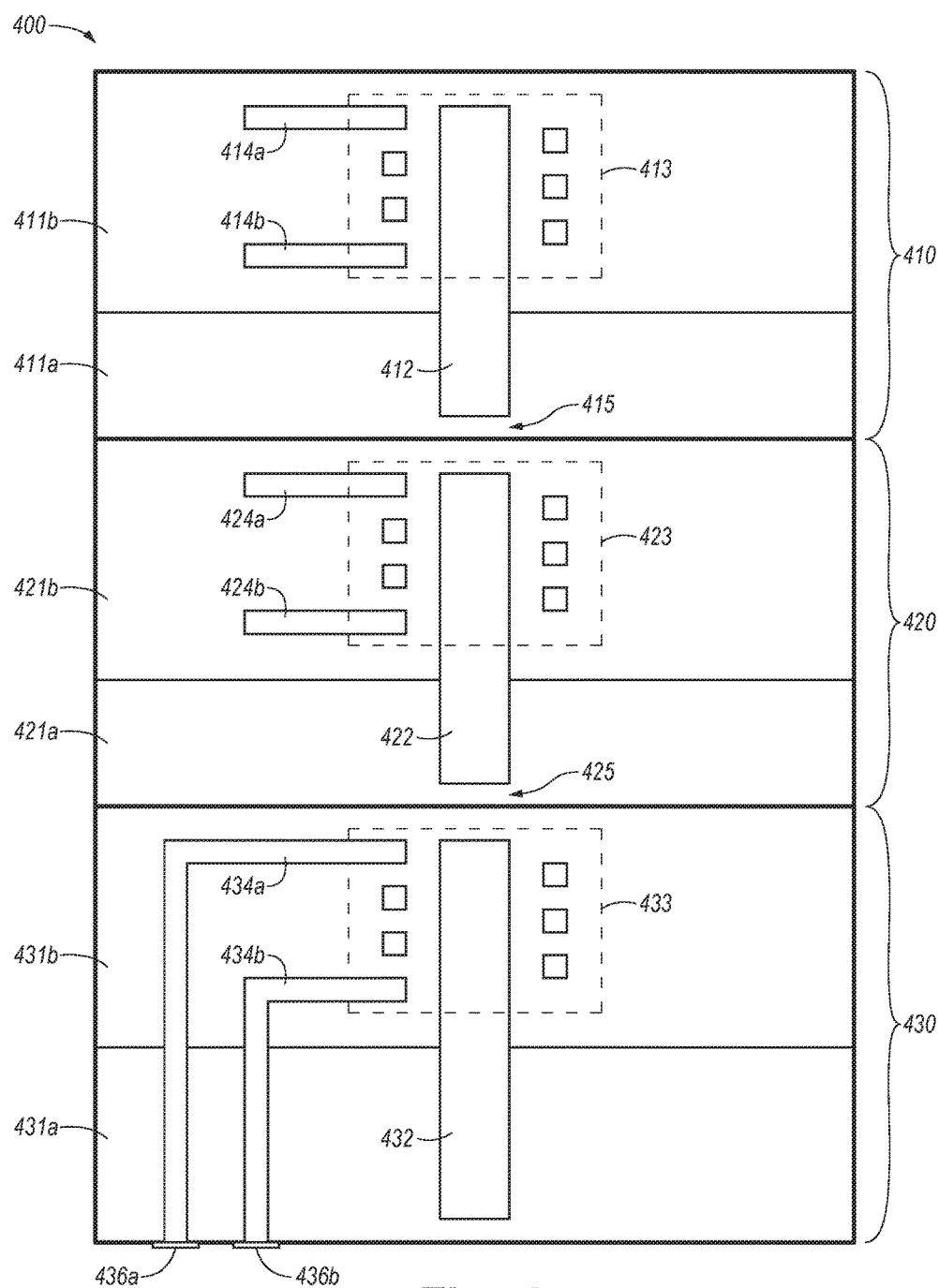
FIG. 4 is a simplified cross-sectional view of a multi-die semiconductor device including coupled inductors with through-substrate via cores configured in accordance with an embodiment of the present technology.

Although the foregoing embodiments of FIGS. 1 and 3 have illustrated semiconductor devices with two dies, in other embodiments of the present technology, semiconductor devices can include larger stacks of any number of dies with coupled inductors. For example, FIG. 4 is a simplified cross-sectional view of a multi-die semiconductor device including coupled inductors with TSV cores configured in accordance with an embodiment of the present technology. The device 400 includes a first die 410, a second die 420 and a third die 430. The first die has a first substrate 411a and a first insulating material 411b. The device 400 further includes a first TSV 412 that extends at least substantially through the first die 410 (e.g., extending from approximately the bottom of the first substrate 411a to beyond an upper surface of the first substrate 411a—completely through the first substrate 411a—and into the first insulating material 411b). The device 400 also includes a first substantially helical conductor 413 ("conductor 413") disposed around the first TSV 412. In the present embodiment, the first conductor 413 is shown to include three complete turns around the first TSV 412. The first conductor 413 can be operably connected to other circuit elements (not shown) by leads 414a and 414b.

The second die 420 includes a second substrate 421a, a second insulating material 421b, and a second TSV 422 that extends at least substantially through the second die 420 (e.g., extending from approximately the bottom of the substrate 421a to beyond an upper surface of the substrate 421a—completely through the second substrate 421a—and into the second insulating material 421b). The device 400 also includes a second substantially helical conductor 423 ("conductor 423") disposed around the second TSV 422. In the present embodiment, the second conductor 423 is shown to include three complete turns around the second TSV 422. The second conductor 423 can be operably connected by leads 424a and 424b to other circuit elements (not shown), including one or more rectifiers to revert a coupled alternating current to DC and one or more capacitors or other filter elements to provide steady current.

The third die 430 includes a third substrate 431a, a third insulating material 431b, and a third TSV 432 in the third die 430 extending out of the third substrate 431a and into the third insulating material 431b. The device 400 also includes a third substantially helical conductor 433 ("conductor 433") disposed around the third TSV 432. In the present embodiment, the third conductor 433 is shown to include three complete turns around the third TSV 432. The third conductor 433 can be operably connected to other circuit elements (not shown), by leads 434a and 434b which connect the third conductor 433 to pads 436a and 436b.

According to one embodiment, the third conductor 433 is configured to induce a magnetic field in the three TSVs 412, 422 and 432 in response to a current passing through the third conductor 433 (e.g., provided by a voltage applied across the pads 436a and 436b). By changing the current passing through the third conductor 433 (e.g., by applying an alternating current, or by repeatedly switching between high and low voltage states), a changing magnetic field can be induced in the three TSVs 412, 422 and 432, which in turn induces a changing current in the first and second conductors 413 and 423 (e.g., through which the first and second TSVs pass). In this fashion, signals and/or power can be coupled between a circuit comprising the third conductor 433 and others comprising the first and second conductors 413 and 423.

As previously set forth, coaxial columns of TSVs can be coupled in any one of a number of ways to improve the magnetic permeability thereof. For example, in the present embodiment of FIG. 4, the first and second TSVs 412 and 422 are magnetically coupled across a small gap 415 (e.g., filled by insulating material and/or substrate material). The second and third TSVs 422 and 432 are similarly magnetically coupled across another small gap 425. Unlike TSVs configured to carry electrical signals, an insulating gap between coaxial TSVs is not a significant impediment in providing a path with high magnetic permeability. Accordingly, a coaxial column of coupled TSVs can be solely magnetically coupled, rather than mechanically or electrically coupled, in accordance with one embodiment of the present technology.

Figure 5:
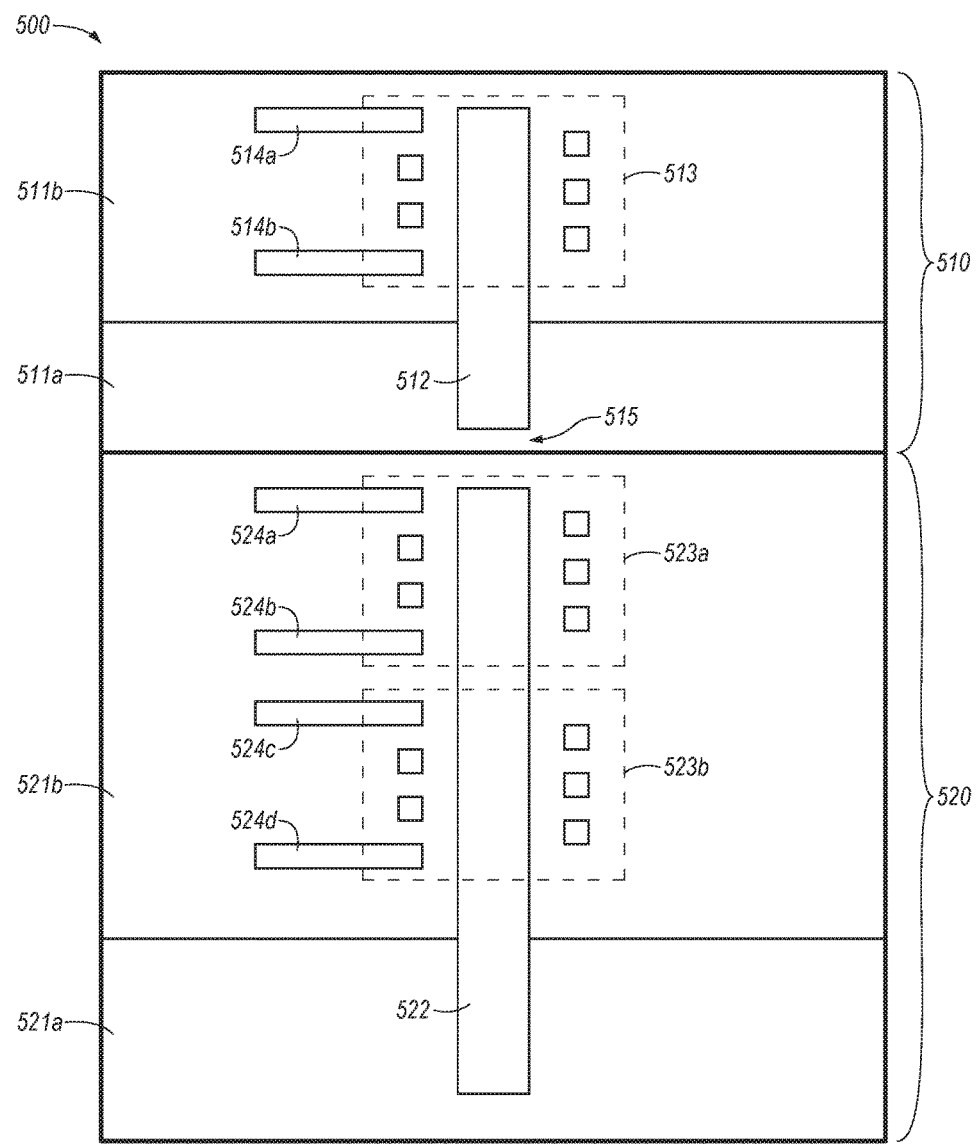
FIG. 5 is a simplified cross-sectional view of a multi-die semiconductor device including coupled inductors with through-substrate via cores configured in accordance with an embodiment of the present technology.

Although the foregoing embodiments of FIGS. 1 through 4 have illustrated inductors with a single substantially helical conductor disposed around each TSV, other embodiments of the present technology can be configured with more than one such conductor around a TSV, as set forth in greater detail below. For example, FIG. 5 is a simplified cross-sectional view of a multi-die semiconductor device 500 including coupled inductors with TSV cores configured in accordance with an embodiment of the present technology. The device 500 includes a first die 510 and a second die 520. The first die includes a first substrate 511a and a first insulating material 511b. The device 500 further includes a first TSV 512 that extends at least substantially through the first die 510 (e.g., extending from approximately the bottom of the first substrate 511a to beyond an upper surface of the first substrate 511a—completely through the first substrate 511a—and into the first insulating material 511b). The device 500 also includes a first substantially helical conductor 513 ("conductor 513") disposed around the first TSV 512. In the present embodiment, the first conductor 513 is shown to include three complete turns around the first TSV 512. The first conductor 513 can be operably connected to other circuit elements (not shown) by leads 514a and 514b.

The second die 520 includes second substrate 521a, a second insulating material 521b, and a second TSV 522 that extends out of the second substrate 521a and into the second insulating material 521b. The second TSV 522 is magnetically coupled to the first TSV 512 in the first die 510 across a small gap 515. The device 500 also includes a second substantially helical conductor 523a ("conductor 523a") disposed around a portion of the second TSV 522, and a third substantially helical conductor 523b ("conductor 523b") disposed around another portion of the second TSV 522. In the present embodiment, the second and third conductors 523a and 523b are shown to each include three complete turns around the second TSV 522. The second conductor 523a can be operably connected to other circuit elements (not shown) by leads 524a and 524b, and the third conductor 523b can be operably connected to still other circuit elements (not shown) by leads 524c and 524d.

According to one embodiment, the first conductor 513 is configured to induce a magnetic field in the two TSVs 512 and 522 in response to a current passing through the first conductor 513 (e.g., provided by a voltage applied across the leads 514a and 514b). By changing the current passing through the first conductor 513 (e.g., by applying an alternating current, or by repeatedly switching between high and low voltage states), a changing magnetic field can be induced in the two TSVs 512 and 522, which in turn induces a changing current in the second and third conductors 523*a* and 523*b*. In this fashion, signals and/or power can be coupled between a circuit comprising the first conductor 513 and others comprising the second and third conductors 523*a* and 523*b*.

Although FIG. 5 illustrates an embodiment having a die with two substantially helical conductors or windings disposed around a TSV at two different heights (e.g., coaxially but not concentrically), in other embodiments, multiple substantially helical conductors with different diameters can be provided at the same height (e.g., with radially-spaced conductive turns in the same layers). As the inductance of a substantially helical conductor depends, at least in part, on its diameter and radial spacing from the TSV around which it is disposed, such an approach can be used where a reduction in the number of layer processing steps is more desirable than an increase in the inductance of the substantially helical conductor so radially spaced.

Figure 6:
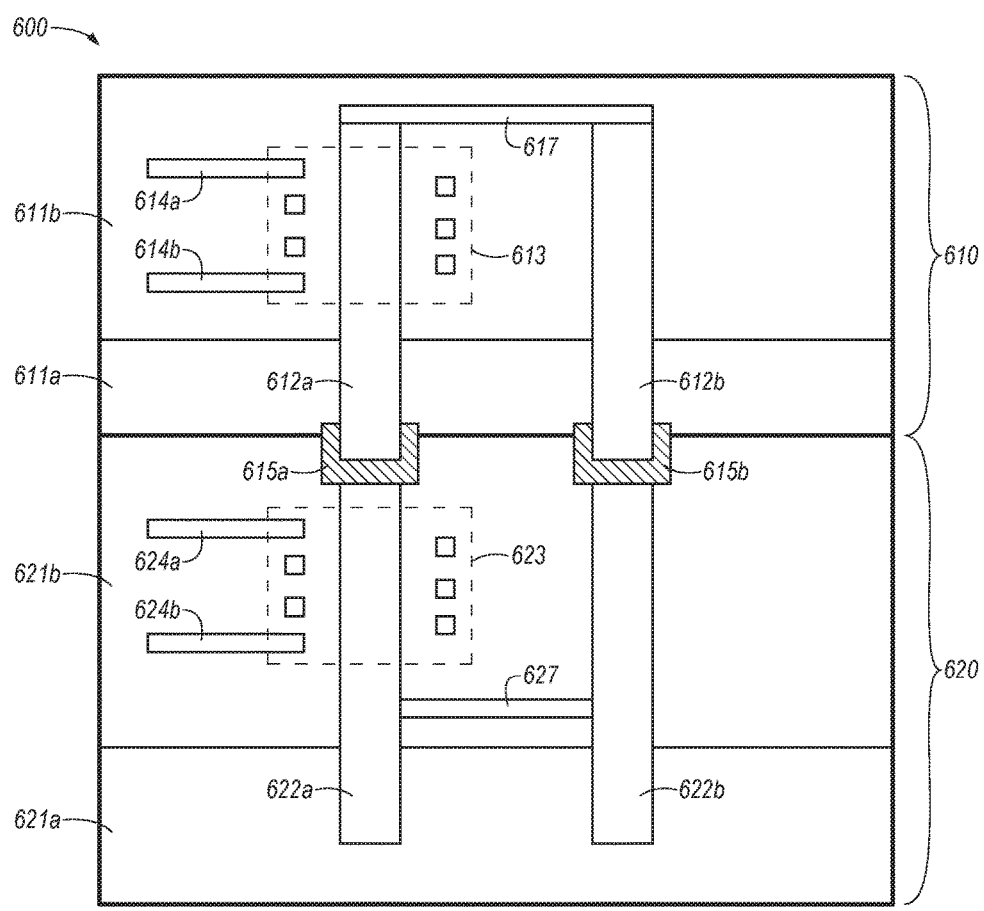
FIG. 6 is a simplified cross-sectional view of a multi-die semiconductor device including coupled inductors with through-substrate via cores configured in accordance with an embodiment of the present technology.

The foregoing example embodiments illustrated in FIGS. 1 through 5 include inductors having an open core (e.g., a core wherein the magnetic field passes through a higher magnetic permeability material for only part of the path of the magnetic field), but embodiments of the present technology can also be provided with a closed core. For example, FIG. 6 is a simplified cross-sectional view of a multi-die semiconductor device 600 including coupled inductors with TSV cores configured in accordance with an embodiment of the present technology. Referring to FIG. 6, the device 600 includes a first die 610 and a second die 620. The first die 610 includes a first substrate 611*a* and a first insulating material 611*b*. The device 600 further includes first and second TSVs 612*a* and 612*b* that extend at least substantially through the first die 610 (e.g., extending from approximately the bottom of the first substrate 611*a* to beyond an upper surface of the first substrate 611*a*—completely through the first substrate 611*a*—and into the first insulating material 611*b*). The device 600 further includes a first substantially helical conductor 613 ("conductor 613") disposed around the first TSV 612*a*. In the present embodiment, the first conductor 613 is shown to include three complete turns around the first TSV 612*a*. The first and second TSVs 612*a* and 612*b* are coupled above the first conductor 613 by an upper coupling member 617 in the first die 610. The first conductor 613 can be operably connected to other circuit elements (not shown) by leads 614*a* and 614*b*.

The second die 620 includes a second substrate 621*a*, a second insulating material 621*b*, and third and fourth TSVs 622*a* and 622*b* that extend out of the second substrate 621*a* and into the second insulating material 621*b*. The third TSV 622*a* is coupled to the first TSV 612*a* in the first die 610 by a first solder connection 615*a*, and the fourth TSV 622*b* is coupled to the second TSV 612*b* in the first die 610 by a second solder connection 615*b*. The device further includes a second substantially helical conductor 623 ("conductor 623") disposed around the third TSV 622*a*. In the present embodiment, the second conductor 623 is shown to include three complete turns around the third TSV 622*a*. The third and fourth TSVs 622*a* and 622*b* are coupled below the second conductor 623 by a lower coupling member 627 in the second die 620. The second conductor 623 can be operably connected to other circuit elements (not shown) by leads 624*a* and 624*b*.

The upper coupling member 617 and the lower coupling member 627 can include a magnetic material, having a magnetic permeability higher than that of the first and second substrates 611*a* and 621*a* and/or the first and second insulating materials 611*b* and 621*b*. The magnetic material of the upper and lower coupling members 617 and 627 can be either the same material as that of the four TSVs 612*a*, 612*b*, 622*a* and 622*b*, or a different material. The magnetic material of the upper and lower coupling members 617 and 627 can be a bulk material (e.g., nickel, iron, cobalt, niobium, or an alloy thereof), or a laminated material with differing layers (e.g., of magnetic material and non-magnetic material). Laminated layers of magnetic and non-magnetic material can help to reduce eddy current losses in the upper and lower coupling members 617 and 627. In accordance with one aspect of the present technology, the four TSVs 612*a*, 612*b*, 622*a* and 622*b*, together with the upper coupling member 617 and the lower coupling member 627, can provide a closed path for the magnetic field induced by the second conductor 623, such that the inductance of the device 600 is greater than it would be if only the four TSVs 612*a*, 612*b*, 622*a* and 622*b* were provided.

According to one embodiment, the second conductor 623 is configured to induce a magnetic field in the four TSVs 612*a*, 612*b*, 622*a* and 622*b* (and in the upper and lower coupling members 617 and 627) in response to a current passing through the second conductor 623 (e.g., provided by a voltage applied across the leads 624*a* and 624*b*). By changing the current passing through the second conductor 623 (e.g., by applying an alternating current, or by repeatedly switching between high and low voltage states), a changing magnetic field can be induced in the four TSVs 612*a*, 612*b*, 622*a* and 622*b* (and in the upper and lower coupling members 617 and 627), which in turn induces a changing current in the first conductor 613. In this fashion, signals and/or power can be coupled between a circuit comprising the second conductor 623 and another comprising the first conductor 613.

Although in the example embodiment illustrated in FIG. 6 coupled inductors are illustrated sharing a closed core (e.g., a core in which a substantially continuous path of high magnetic permeability material passes through the middle of a conductive winding), in other embodiments, one or both of the upper and lower coupling members 617 and 627 could be omitted. In such an embodiment, a secondary coaxial column of TSVs (e.g., in addition to the coaxial column of TSVs around which the windings are disposed) with elevated magnetic permeability could be situated near the coaxial column of TSVs around which the windings are disposed to provide an open core embodiment with improved inductance over an embodiment in which the secondary coaxial column of TSVs was not present.

Figure 7:
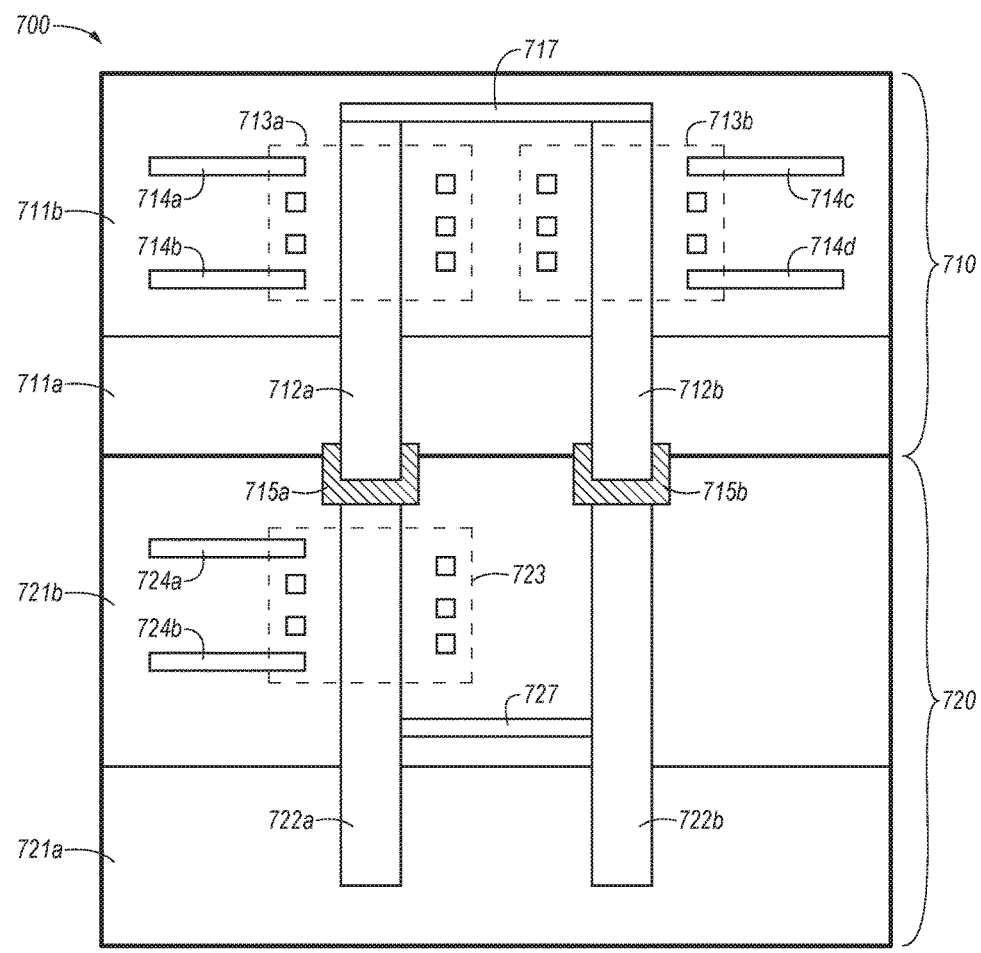
FIG. 7 is a simplified cross-sectional view of a multi-die semiconductor device including coupled inductors with through-substrate via cores configured in accordance with an embodiment of the present technology.

According to one embodiment, a closed magnetic core as illustrated by way of example in FIG. 6 can provide additional space in which one or more windings can be disposed (e.g., to provide a transformer or power couple). For example, although FIG. 6 illustrates a device in which two windings are disposed on the same coaxial column of TSVs, with a proximate column of TSVs having no windings, in another embodiment, two proximate columns of coaxial TSVs could be provided with a single winding on each column (e.g., a primary winding on the first column in a first die, and a secondary winding on the second column in a second die). Alternatively, additional windings can be provided in the space provided by a closed magnetic core or a proximate TSV in an open-core embodiment, to provide more than two coupled inductors that all interact with the same magnetic field. For example, FIG. 7 is a simplified cross-sectional view of coupled inductors with through-substrate via cores configured in accordance with an embodiment of the present technology. As can be seen with reference to FIG. 7, a device 700 includes a first die 710 and a second die 720. The first die 710 includes a first substrate 711a and a first insulating material 711b. The device 700 further includes first and second TSVs 712a and 712b that extend at least substantially through the first die 710 (e.g., extending from approximately the bottom of the first substrate 711a to beyond an upper surface of the first substrate 711a—completely through the first substrate 711a—and into the first insulating material 711b). The device 700 further includes a first substantially helical conductor 713a ("conductor 713a") disposed around the first TSV 712a. In the present embodiment, the first conductor 713a is shown to include three complete turns around the first TSV 712a. The device 700 further includes a second substantially helical conductor 713b ("conductor 713b") disposed around the second TSV 712b. In the present embodiment, the second conductor 713b is shown to include three complete turns around the second TSV 712b. The first and second TSVs 712a and 712b are coupled above the first and second conductors 713a and 713b by an upper coupling member 717 in the first die 710. The first conductor 713a can be operably connected to other circuit elements (not shown) by leads 714a and 714b, and the second conductor 713b can be operably connected to other circuit elements (not shown) by leads 714c and 714d.

The second die 720 includes a second substrate 721a, a second insulating material 721b, and third and fourth TSVs 722a and 722b that extend out of the second substrate 721a and into the second insulating material 721b. The third TSV 722a is coupled to the first TSV 712a in the first die 710 by a first solder connection 715a, and the fourth TSV 722b is coupled to the second TSV 712b in the first die 710 by a second solder connection 715b. In other embodiments, TSVs in adjacent dies can be coupled using any one of a number of other interconnect methods (e.g., copper-to-copper bonding, pill and pad, interference fit, mechanical, etc.). The device further includes a third substantially helical conductor 723 ("conductor 723") disposed around the third TSV 722a. In the present embodiment, the third conductor 723 is shown to include three complete turns around the third TSV 722a. The third and fourth TSVs 722a and 722b are coupled below the third conductor 723 by a lower coupling member 727 in the second die 720. The third conductor 723 can be operably connected to other circuit elements (not shown) by leads 724a and 724b.

The upper coupling member 717 and the lower coupling member 727 can include a magnetic material having a magnetic permeability higher than that of the first and second substrates 711a and 721a and/or the first and second insulating materials 711b and 721b. The magnetic material of the upper and lower coupling members 717 and 727 can be either the same material as that of the four TSVs 712a, 712b, 722a and 722b, or a different material. The magnetic material of the upper and lower coupling members 717 and 727 can be a bulk material (e.g., nickel, iron, cobalt, niobium, or an alloy thereof), or a laminated material with differing layers (e.g., of magnetic material and non-magnetic material). Laminated layers of magnetic and non-magnetic material can help to reduce eddy current losses in the upper and lower coupling members 717 and 727. In accordance with one aspect of the present technology, the four TSVs 712a, 712b, 722a and 722b, together with the upper coupling member 717 and the lower coupling member 727, can provide a closed path for the magnetic field induced by the third conductor 723, such that the inductance of the device 700 is greater than it would be if only the four TSVs 712a, 712b, 722a and 722b were provided.

According to one embodiment, the third conductor 723 is configured to induce a magnetic field in the four TSVs 712a, 712b, 722a and 722b (and in the upper and lower coupling members 717 and 727) in response to a current passing through the third conductor 723 (e.g., provided by a voltage applied across the leads 724a and 724b). By changing the current passing through the third conductor 723 (e.g., by applying an alternating current, or by repeatedly switching between high and low voltage states), a changing magnetic field can be induced in the four TSVs 712a, 712b, 722a and 722b (and in the upper and lower coupling members 717 and 727), which in turn induces a changing current in the first and second conductors 713a and 713b. In this fashion, signals and/or power can be coupled between a circuit comprising the third conductor 723 and others comprising the first and second conductors 713a and 713b.

Although in the embodiment illustrated in FIG. 7 two coupled inductors on proximate are shown with the same number of turns, in other embodiments of the present technology different numbers of windings can be provided on similarly-configured inductors. As will be readily understood by one skilled in the art, by providing coupled inductors with different numbers of windings, a device so configured can be operated as a step-up or step-down transformer (depending upon which conductor is utilized as the primary winding and which the secondary winding).

Although in the embodiments illustrated in FIGS. 6 and 7 a single additional coaxial column of coupled TSVs is provided to enhance the magnetic permeability of the return path for the magnetic field generated by a primary winding around a first coaxial column of TSVs, in other embodiments of the present technology multiple return path coaxial columns of TSVs can be provided to further improve the inductance of the inductors so configured. For example, embodiments of the present technology may use two, three, four, or any number of additional coaxial columns of coupled TSVs to provide a return path for the magnetic field with enhanced magnetic permeability. Such additional coaxial columns of coupled TSVs may be coupled by upper and/or lower coupling members to the coaxial column of coupled TSVs around which one or more substantially helical conductors are disposed (e.g., a closed core configuration), or may merely be sufficiently proximate to concentrate some of the magnetic flux of the return path of the magnetic field to enhance the performance of the device so configured.

Figure 8:
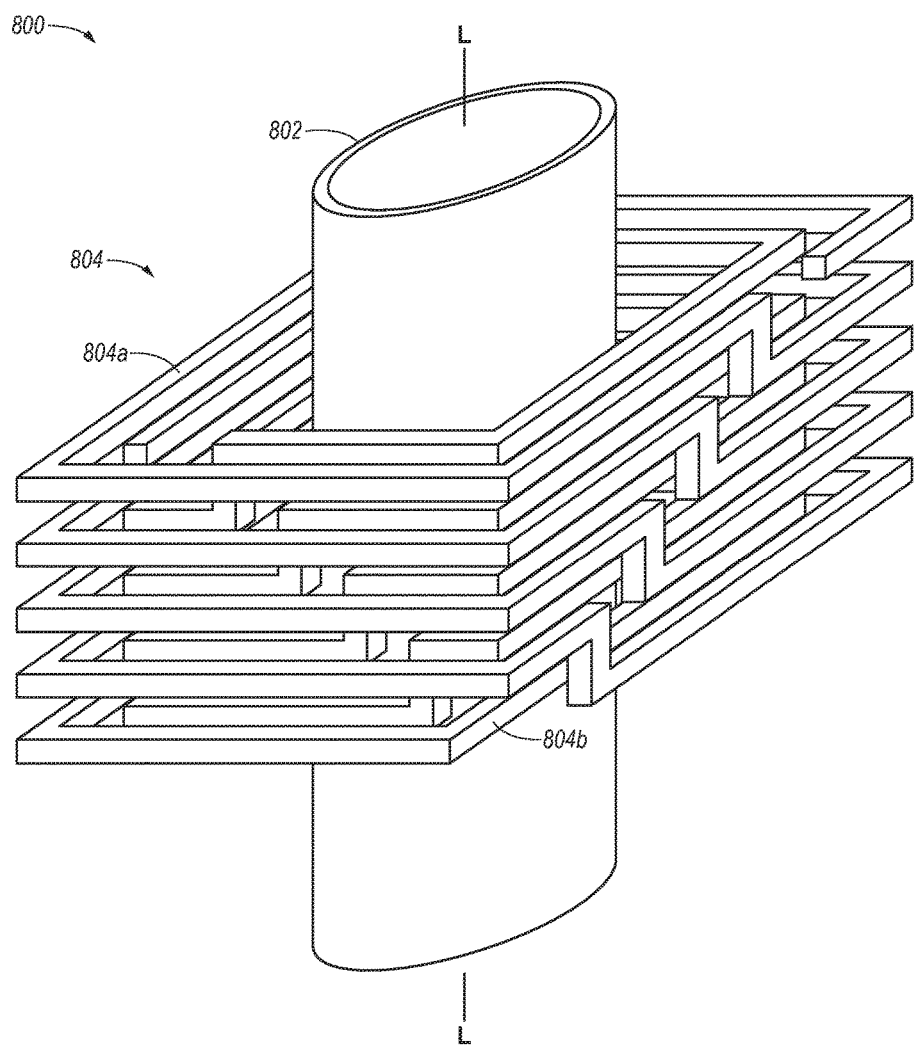
FIG. 8 is a simplified perspective view of a substantially helical conductor disposed around a through-substrate via configured in accordance with an embodiment of the present technology.

Although in the foregoing examples set forth in FIGS. 1 to 7 each substantially helical conductor has been illustrated as having a single turn about a TSV at a given distance from the surface of a corresponding substrate, in other embodiments a substantially helical conductor can have more than one turn about a TSV at the same distance from the substrate surface (e.g., multiple turns arrange coaxially at each level). For example, FIG. 8 is a simplified perspective view of a structure 800 comprising a substantially helical conductor 804 ("conductor 804") disposed around a through-substrate via 802 configured in accordance with an embodiment of the present technology. As can be seen with reference to FIG. 8, the conductor 804 includes a first substantially helical conductor 804a ("conductor 804a") disposed around the TSV 802, which is connected to a second coaxially-aligned substantially helical conductor 804b ("conductor 804b"), such that a single conductive path winds downward around TSV 802 at a first average radial distance, and winds back upward around TSV 802 at a second average radial distance. Accordingly, the conductor 804 includes two turns about the TSV 802 (e.g., the topmost turn of conductor 804a and the topmost turn of conductor 804*b*) at the same position along the longitudinal dimension "L" of the TSV 802. In another embodiment, a substantially helical conductor could make two turns about a TSV at a first level (e.g., spiraling outward), two turns about a TSV at a second level (e.g., spiraling inward), and so on in a similar fashion for as many turns as were desired.

Figure 9A:
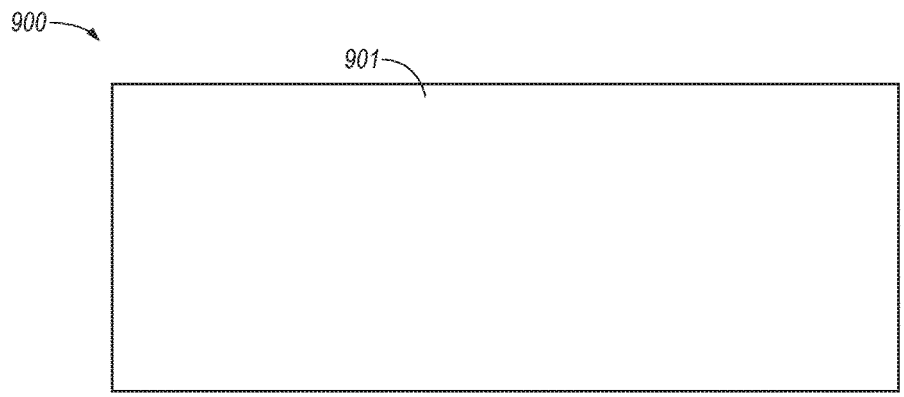
FIGS. 9A through 9D are simplified cross-sectional views of a multi-die semiconductor device including coupled inductors with through-substrate via cores at various stages of a manufacturing process in accordance with an embodiment of the present technology.
Figure 9B:
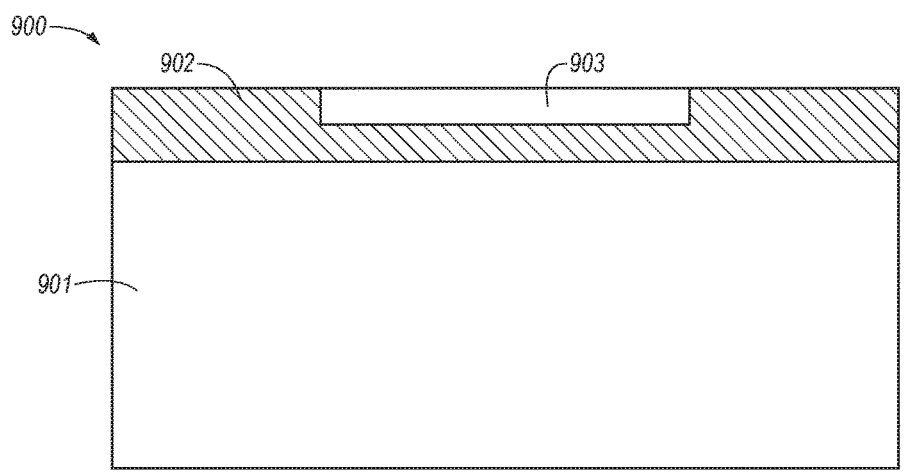

FIGS. 9A-9F are simplified views of a device 900 having an inductor with a through-substrate via core in various states of a manufacturing process in accordance with an embodiment of the present technology. In FIG. 9A, a substrate 901 is provided in anticipation of further processing steps. The substrate 901 may be any one of a number of substrate materials, including silicon, glass, gallium arsenide, gallium nitride, organic laminates, molding compounds (e.g., for reconstituted wafers for fan-out wafer-level processing) and the like. In FIG. 9B, a first turn 903 of a substantially helical conductor has been disposed in a layer of the insulating material 902 over the substrate 901. The insulating material 902 can be any one of a number of insulating materials which are suitable for semiconductor processing, including silicon oxide, silicon nitride, polyimide, or the like. The first turn 903 can be any one of a number of conducting materials which are suitable for semiconductor processing, including copper, gold, tungsten, alloys thereof, or the like.

Figure 9C:
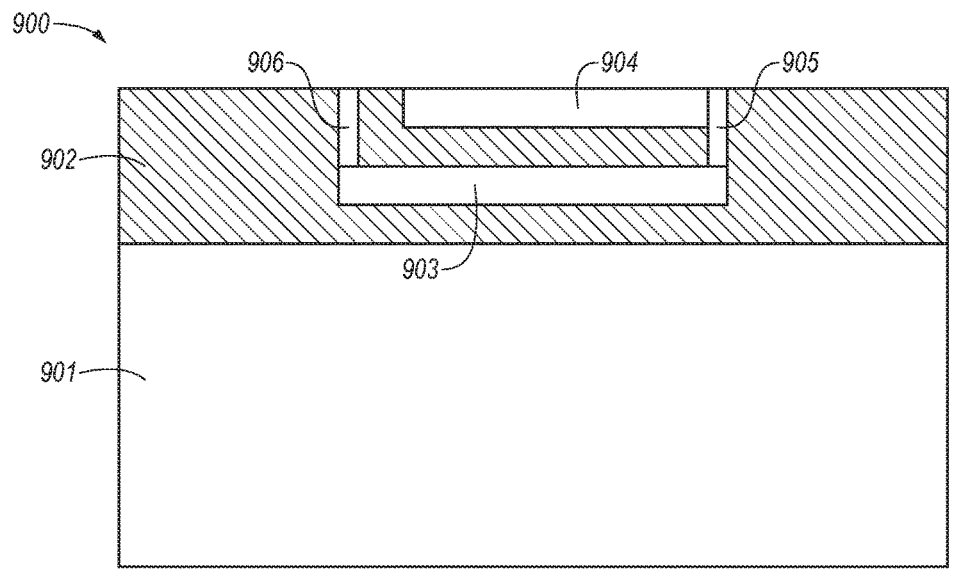
Figure 9D:
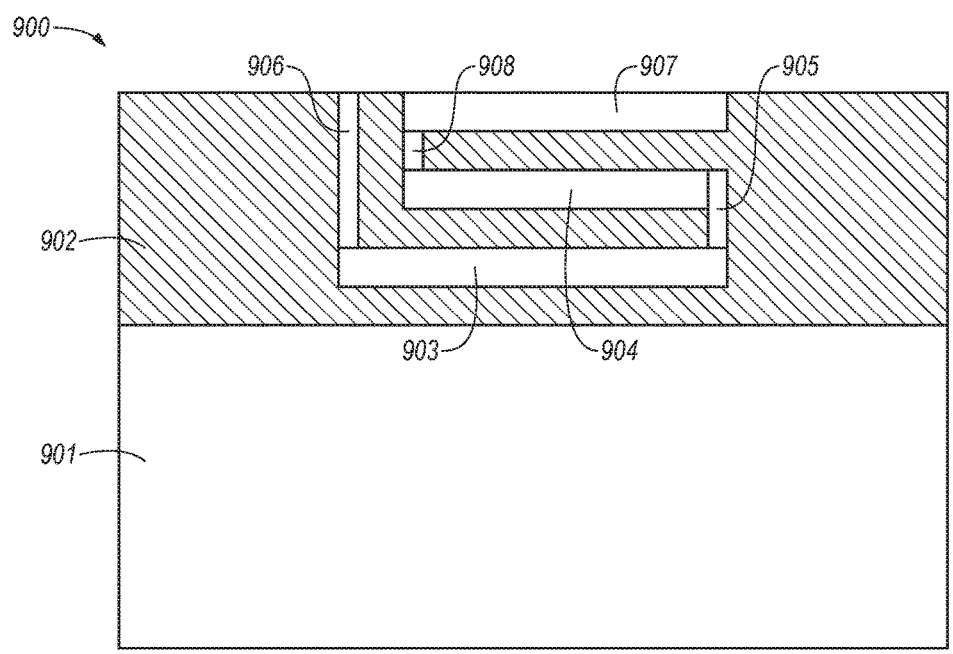

In FIG. 9C, a second turn 904 of the substantially helical conductor has been disposed in the now thicker layer of the insulating material 902, and spaced from the first turn 903 by a layer of the insulating material 902. The second turn 904 is electrically connected to the first turn 903 by a first via 905. A second via 906 has also been provided to route an end of the first turn 903 to an eventual higher layer of the device 900. In FIG. 9D, a third turn 907 of the substantially helical conductor has been disposed in the now thicker layer of the insulating material 902, and spaced from the second turn 904 by a layer of the insulating material 902. The third turn 907 is electrically connected to the second turn 904 by a third via 908. The second via 906 has been further extended to continue routing an end of the first turn 903 to an eventual higher layer of the device 900.

Figure 9E:
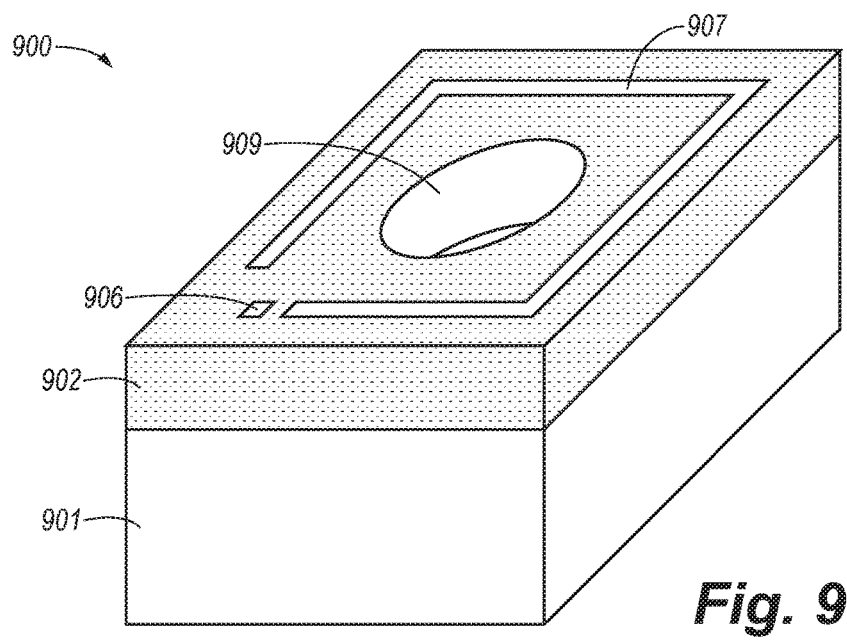
FIGS. 9E through 9H are simplified perspective views of a multi-die semiconductor device including coupled inductors with through-substrate via cores at various stages of a manufacturing process in accordance with an embodiment of the present technology.
Figure 9F:
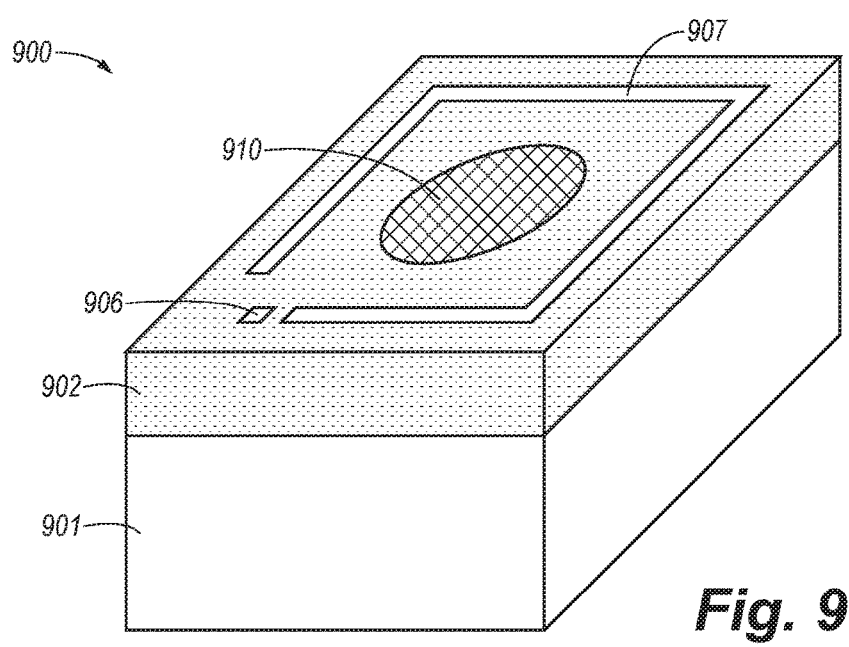

Turning to FIG. 9E, the device 900 is illustrated in a simplified perspective view after an opening 909 has been etched through the insulating material 902 and into the substrate 901. The opening 909 is etched substantially coaxially with the turns 903, 904 and 907 of the substantially helical conductor using any one of a number of etching operations capable of providing a substantially vertical opening with a high aspect ratio. For example, deep reactive ion etching, laser drilling, or the like can be used to form the opening 909. In FIG. 9F, a TSV 910 has been disposed in the opening 909. The TSV 910 can include a magnetic material (e.g., a material with a higher magnetic permeability than the substrate 901 and/or the insulating material 902) to increase the magnetic field in the TSV 910 when current is flowing through the substantially helical conductor. The magnetic material can be ferromagnetic, ferrimagnetic, or a combination thereof. The TSV 910 can include more than one material, either in a bulk material of a single composition, or in discrete regions of different materials (e.g., coaxial laminate layers). For example, the TSV 910 can include nickel, iron, cobalt, niobium, or alloys thereof. Laminated layers of magnetic and non-magnetic material can help to reduce eddy current losses in the TSV 910. The TSV 910 can be provided in a single metallization step filling in the opening 909, or in multiple steps of laminating layers (e.g., multiple magnetic layers separated by non-magnetic layers). In one embodiment, to provide a TSV with a multiple layer structure, a mixture of conformal and bottom-up fill plating operations can be utilized (e.g., a conformal plating step to partially fill and narrow the etched opening with a first material, and a subsequent bottom-up plating step to completely fill the narrowed opening with a second material).

Figure 9G:
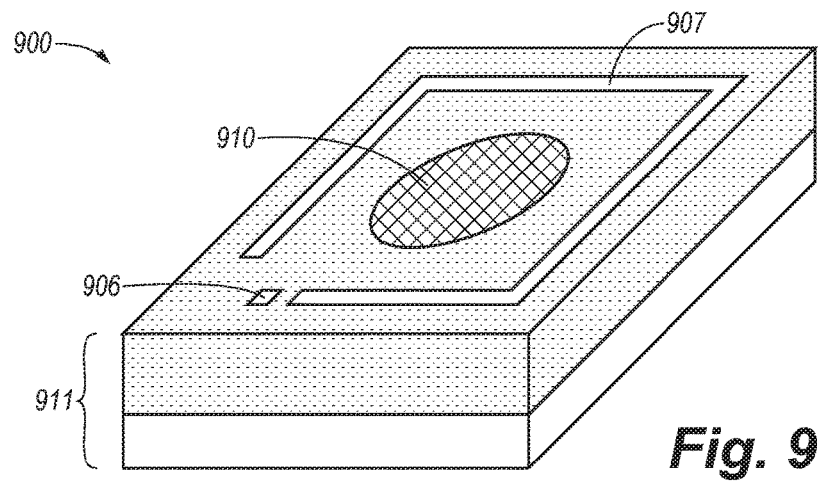
Figure 9H:
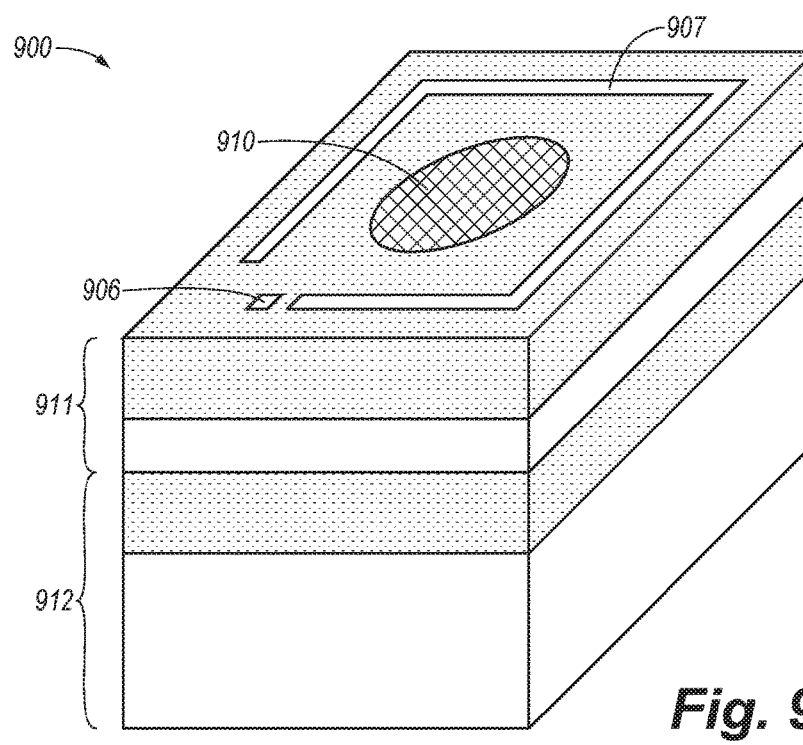

Turning to FIG. 9G, the device 900 is illustrated after the substrate 901 has been thinned to expose or reduce the distance between a bottom surface of the substrate 901 and a bottom end of the TSV 910, to provide a thinned die 911. In FIG. 9H, the device 900 is illustrated after the thinned die 911 has been disposed over a second die 912 in which another TSV is surrounded by a substantially helical conductor. The TSV 910 and the coaxially aligned TSV of the second die 912 can be coupled in a variety of ways, including by solder connection, copper-to-copper bonding, pill and pad, interference fit, mechanical connection, or magnetic coupling across a small gap (e.g., of insulating material and/or substrate material).

Figure 10:
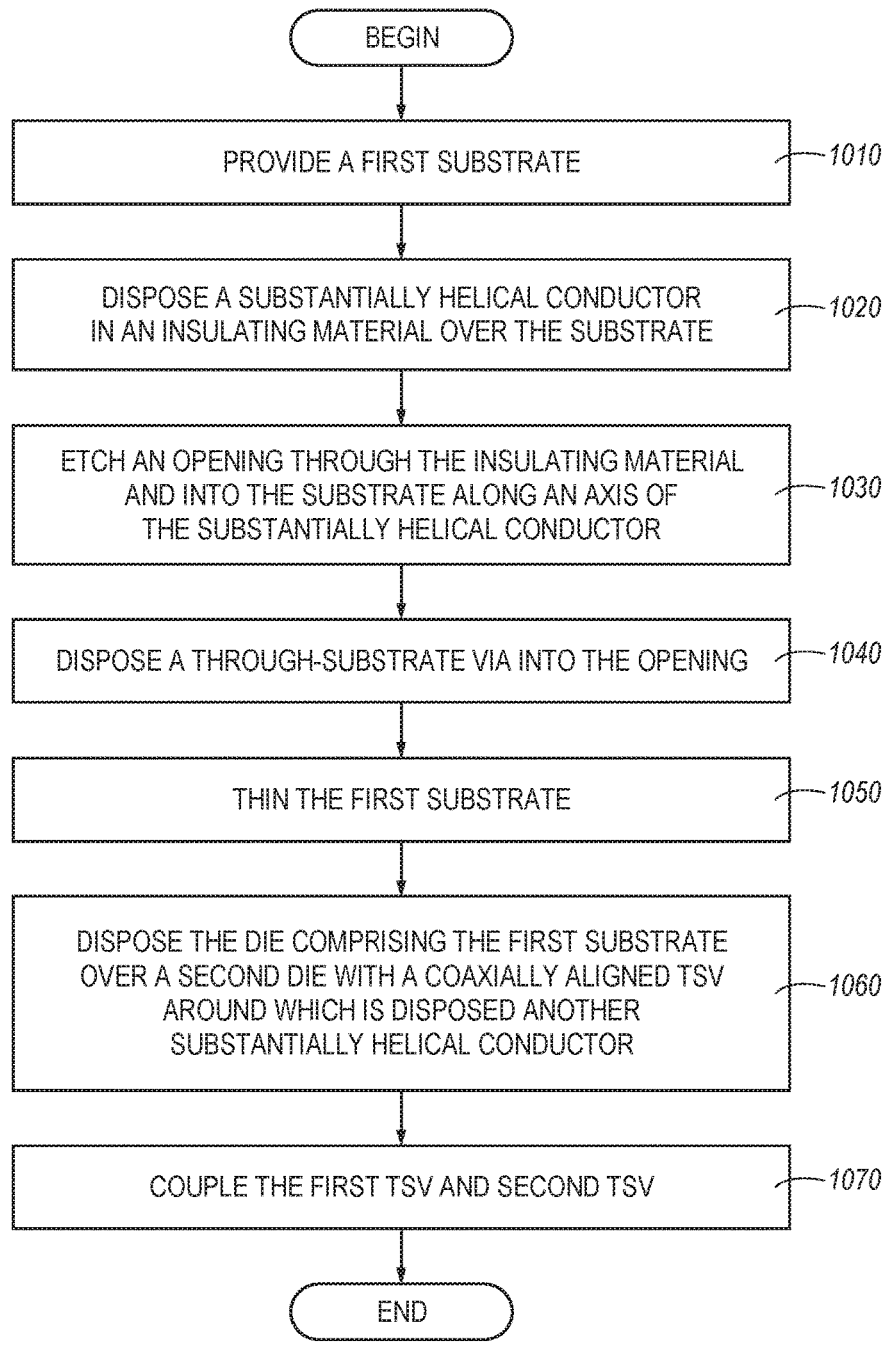
FIG. 10 is a flow chart illustrating a method of manufacturing a multi-die semiconductor device including coupled inductors with through-substrate via cores in accordance with an embodiment of the present technology.

FIG. 10 is a flow chart illustrating a method of manufacturing an inductor with a through-substrate via core in accordance with an embodiment of the present technology. The method begins in step 1010, in which a substrate is provided. In step 1020, a substantially helical conductor is disposed in an insulating material over the substrate. In step 1030, an opening is etched through the insulating material and into the substrate along an axis of the substantially helical conductor. In step 1040, a TSV is disposed into the opening. In step 1050, the substrate is thinned to expose or reduce the distance between a bottom surface of the substrate and a bottom end of the TSV. In step 1060, the die comprising the first substrate is disposed over a second die with a coaxially aligned TSV around which is disposed another substantially helical conductor. In step 1070, the first TSV and the second TSV are coupled (e.g., by a solder connection, or a mechanical connection, or by a magnetic coupling across a gap).

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A semiconductor device, comprising:
   a first die including:
     a first through-substrate via (TSV) extending at least substantially through the first die, and
     a first substantially helical conductor disposed around the first TSV; and
   a second die including:
     a second TSV coupled to the first TSV, and
     a second substantially helical conductor disposed around the second TSV,
   wherein the second TSV is coupled to the first TSV by a solder connection, and wherein the solder connection is separated from the first and second TSVs by a barrier material configured to prevent solder diffusion into the first and second TSVs.

2. The semiconductor device of claim 1, wherein the first substantially helical conductor is configured to induce a change in a magnetic field in the first and second TSVs in response to a first changing current in the first substantially helical conductor, and wherein the second substantially helical conductor is configured to have a second changing current induced therein in response to the change in the magnetic field in the second TSV.

3. The semiconductor device of claim 1, wherein the solder connection comprises a magnetic material.

4. The semiconductor device of claim 1, wherein the first TSV and the second TSV are coaxially aligned.

5. The semiconductor device of claim 1, wherein the first and second TSVs comprise a ferromagnetic or a ferrimagnetic material.

6. The semiconductor device of claim 1, wherein the first TSV is separated from the first substantially helical conductor by an insulating material, and the second TSV is separated from the second substantially helical conductor by an insulating material.

7. The semiconductor device of claim 1, wherein the first substantially helical conductor comprises more than one turn around the first TSV, and the second substantially helical conductor comprises more than one turn around the second TSV.

8. The semiconductor device of claim 1, wherein the first substantially helical conductor is coaxially aligned with the first TSV.

9. The semiconductor device of claim 1, wherein the second substantially helical conductor is coaxially aligned with the second TSV.

10. A semiconductor device, comprising:
a first die including:
a first through-substrate via (TSV) extending at least substantially through the first die,
a second TSV extending at least substantially through the first die, and
a first substantially helical conductor disposed around one of the first and second TSVs,
a second die including:
a third TSV coupled to the first TSV,
a fourth TSV coupled to the second TSV, and
a second substantially helical conductor disposed around one of the third and fourth TSVs,
wherein the third TSV is coupled to the first TSV by a first solder connection, wherein the fourth TSV is coupled to the second TSV by a second solder connection, and wherein the first solder connection is separated from the first and third TSVs by a barrier material configured to prevent solder diffusion into the first and third TSVs.

11. The semiconductor device of claim 10, wherein the first substantially helical conductor is configured to induce a change in a magnetic field in the first, second, third and fourth TSVs in response to a first changing current in the first substantially helical conductor, and wherein the second substantially helical conductor is configured to have a second changing current induced therein in response to the change in the magnetic field in the TSV around which the second substantially helical conductor is disposed.

12. The semiconductor device of claim 10, wherein the first, second, third and fourth TSVs comprise a ferromagnetic or a ferrimagnetic material.

13. The semiconductor device of claim 10, wherein the second TSV is coupled to the first TSV by an upper coupling member above the first substantially helical conductor.

14. The semiconductor device of claim 13, wherein the upper coupling member comprises a ferromagnetic or a ferrimagnetic material.

15. The semiconductor device of claim 10, wherein the fourth TSV is coupled to the third TSV by a lower coupling member below the second substantially helical conductor.

16. The semiconductor device of claim 15, wherein the lower coupling member comprises a ferromagnetic or a ferrimagnetic material.

17. The semiconductor device of claim 10, wherein the third and fourth TSVs extend at least substantially through the second die.

18. The semiconductor device of claim 10, wherein the second solder connection is separated from the second and fourth TSVs by a barrier material configured to prevent solder diffusion into the second and fourth TSVs.

19. The semiconductor device of claim 10, wherein the first and second solder connections comprise a magnetic material.

20. The semiconductor device of claim 10, wherein the first substantially helical conductor is disposed around the first TSV, and the second substantially helical conductor is disposed around the third TSV.

* * * * *